United States Patent
Ibrahim et al.

(10) Patent No.: US 9,823,125 B2
(45) Date of Patent: Nov. 21, 2017

(54) SYSTEM AND METHOD FOR DYNAMICALLY SWEEPING A TUNABLE LASER

(71) Applicant: FAZ TECHNOLOGY LIMITED, Dublin (IE)

(72) Inventors: Selwan Ibrahim, Dublin (IE); John O'Dowd, Dublin (IE); Martin Farnan, Dublin (IE); Roger Maher, Dublin (IE); Tom Farrell, Dublin (IE); John Dunne, Dublin (IE)

(73) Assignee: FAZ TECHNOLOGY LIMITED, Dublin (IE)

( * ) Notice: Subject to any disclaimer, the term of this patent is extended or adjusted under 35 U.S.C. 154(b) by 285 days.

(21) Appl. No.: 14/419,818

(22) PCT Filed: Aug. 7, 2013

(86) PCT No.: PCT/EP2013/066556
§ 371 (c)(1),
(2) Date: Feb. 5, 2015

(87) PCT Pub. No.: WO2014/023770
PCT Pub. Date: Feb. 13, 2014

(65) Prior Publication Data
US 2015/0185073 A1     Jul. 2, 2015

Related U.S. Application Data

(60) Provisional application No. 61/680,485, filed on Aug. 7, 2012.

(30) Foreign Application Priority Data

Aug. 7, 2012 (EP) .................................. 12179598

(51) Int. Cl.
G01J 1/42 (2006.01)
G01J 3/02 (2006.01)
(Continued)

(52) U.S. Cl.
CPC .............. G01J 3/027 (2013.01); G01B 11/18 (2013.01); G01D 5/35335 (2013.01);
(Continued)

(58) Field of Classification Search
CPC . G01J 3/027; G01J 3/1895; G01J 3/45; G01B 11/18
See application file for complete search history.

(56) References Cited

U.S. PATENT DOCUMENTS 5,401,956 A    3/1995 Dunphy et al.
7,649,917 B2 *  1/2010 Mullane ................ H01S 5/0625
372/20

(Continued)

OTHER PUBLICATIONS

International Search Report and Written Opinion Form PCT/ISA/220, International Application No. PCT/EP2013/066556, dated Feb. 20, 2014, pp. 1-14.

(Continued)

*Primary Examiner* — Michael P Stafira
(74) *Attorney, Agent, or Firm* — Bond, Schoeneck & King, PLLC; William Greener

(57) ABSTRACT

The invention provides a dynamically swept tunable laser system and method for measuring sensor characteristics obtained from an array of optical sensors comprising means for dividing the total wavelength sweep of the laser into different regions in any particular order where each region contains single or multiple contiguous sweep segments and where each sweep segment is referenced by a start and a stop reference and can have different lengths compared to the other sweep segments. The sensor characteristics are determined from each region swept by the tunable laser. The (Continued)

invention provides for the tunable laser to be adapted to operate in a quasi-continuous mode to select segments in any order. The relative sweep rates of regions can be changed such that some regions can be swept more times than other regions.

25 Claims, 6 Drawing Sheets

(51) Int. Cl.
| | |
|---|---|
| *H01S 5/0687* | (2006.01) |
| *G01K 11/32* | (2006.01) |
| *G01B 11/16* | (2006.01) |
| *G01L 1/24* | (2006.01) |
| *G01J 3/18* | (2006.01) |
| *G01J 3/45* | (2006.01) |
| *G01D 5/353* | (2006.01) |
| *H01S 5/00* | (2006.01) |
| *H01S 5/06* | (2006.01) |
| *H01S 5/12* | (2006.01) |

(52) U.S. Cl.
CPC .............. *G01J 3/1895* (2013.01); *G01J 3/45* (2013.01); *G01K 11/3206* (2013.01); *G01L 1/246* (2013.01); *H01S 5/0687* (2013.01); *H01S 5/0014* (2013.01); *H01S 5/0617* (2013.01); *H01S 5/1209* (2013.01)

(56) References Cited

U.S. PATENT DOCUMENTS

| | | | |
|---|---|---|---|
| 8,552,360 B2 * | 10/2013 | Taverner | ............ G01J 3/02 250/227.23 |
| 2007/0280703 A1 | 12/2007 | Taverner et al. | |
| 2011/0249973 A1 | 10/2011 | Donlagic et al. | |

OTHER PUBLICATIONS

O'Connor, Shane, et al., Nov. 9, 2008, "Generation of High Speed, Linear Wavelength Sweeps Using Sampled Grating Distributed Bragg Reflector Lasers", 2008 IEEE Leos Annual Meeting Conference Proceedings, Newport Beach, California, USA, pp. 9-13, Nov. 2008, IEEE, Piscataway, NJ, USA, pp. 147-148, XP031366144.

* cited by examiner

SYSTEM AND METHOD FOR DYNAMICALLY SWEEPING A TUNABLE LASER

FIELD OF THE INVENTION

The invention relates to a method and system for processing signals from an optical sensor array using a dynamically swept tunable laser.

BACKGROUND TO THE INVENTION

Optical sensors (Fibre Bragg Gratings (FBG)) have been proposed for many sensing applications. For example a tunable laser can be used to read the values on the sensors arranged in serial or parallel combination of sensors.

The measurement source changes the centre wavelength of the bragg reflectors in the fibre sensors. A tunable laser can be used to sweep across all wavelengths and to find the peak of the wavelength signal for each sensor. These wavelength peak movements are in proportion to the measurement source. The measurement of changes on the FBG sensors is referred to as an interrogator system.

One problem of an interrogator system is that the laser must sweep over a broad range. This broad range slows down the effective measurement speed because the actual data may only be contained in less than 10% of the wavelength spectrum measured. One such interrogator system is disclosed in U.S. Pat. No. 7,649,917, assigned to Intune Networks Limted, provides a tunable laser that scans across all segments in a continuous fashion before determining the sensor wavelengths of interest. The interrogator must sweep over the entire wavelength range which causes in-efficient use of the sweep band/speed as the actual data may only be contained in less than 10% of the wavelength spectrum measured.

Other reported interrogators and tunable laser swept sources also suffer from similar problems, as disclosed in US2011/249973 A1, assigned to University of Maribor, and a conference paper in IEEE LEOS annual meeting 2008, pages 137-148, XP031366144, ISBN: 978-1-4244-1931-9 entitled 'Generation of high speed, linear wavelength sweeps using sampled grating distributed bragg reflector lasers' Shane O'Conner et al.

There is therefore a need to provide an improved dynamically swept tunable laser interrogator system and method.

SUMMARY OF THE INVENTION

According to the invention there is provided, as set out in the appended claims, a tunable laser system for measuring sensor characteristics obtained from an array of optical sensors, said system comprising:
means for dividing the total wavelength sweep of the laser into segments where the tuning across a segment is continuous;
each segment is referenced by a start and a stop reference;
means for performing a sweep made up from a number of regions such that a region comprises a group of contiguous segments; and
sensor characteristics are determined from each region swept by the tunable laser.

In another embodiment there is provided a dynamically swept tunable laser system to measure sensor characteristics obtained from an array of optical sensors from at least one wavelength sweep, said system comprising:
means for dividing the total wavelength sweep of the laser into a plurality of regions in any particular order where each region comprises at least one or more contiguous sweep segments;
each sweep segment is referenced by a start and a stop reference and selected with different lengths compared to other sweep segments; and
means for determining sensor characteristics from each segment swept by the tunable laser, wherein the tunable laser will only interrogate segments where sensor characteristics are determined for a subsequent wavelength sweep.

The invention provides an adaptive system 10 that uses means to measure the location of the wavelength peaks, and then adjust the sweep ranges in order to skip measuring the blank spaces in between the sensors. The invention provides for the tunable laser to be adapted to operate in a quasi-continuous mode to select segments in any order. The relative sweep rates of regions can be changed such that some regions can be swept more times than other regions. This adaptive system allows more sensors per laser, lowering the cost, by speeding up the sweep. More importantly, the more sweeps i.e. the faster you can measure, the more averaging that can be performed to remove the white noise components of the system and thereby increase the accuracy of the measurement.

An advantage can be gained using modified sweeps which improves the accuracy of the results and increases the number of sensors that can be interrogated by the laser(s) in the system. Extensions to the system can also be accommodated through the use of multiple lasers sweeping multiple segments of the wavelength bandwidth simultaneous or in sequence depending on the problem to be solved.

In one embodiment the means for determining the sensor characteristics comprises identifying segments where wavelength peaks are located and removing segments of the sweep where no wavelength peaks are detected, such that only segments with a wavelength peak are swept by the tunable laser for a subsequent wavelength sweep.

In one embodiment the tunable laser is adapted to operate in a quasi-continuous mode to select regions and segments in any order.

In one embodiment the tunable laser is adapted to operate in a dynamic mode where it could be used to interrogate different sensors at different speeds placed on a single fibre.

In one embodiment the relative sweep rates of regions can be changed such that some regions can be swept more times than other regions.

In one embodiment a control loop is used to adjust the start and stop wavelength of each region based on the previous reflected characteristics of a sensor located in that wavelength region.

In one embodiment a processing algorithm is used to determine sensor characteristics and adapted to adjust the sweep rate based on the sweep rate of the region and/or one or more previous performed sweeps of the sensor.

In one embodiment there is provided a feedback control loop adapted to adjust the wavelength region and/or segment sizes.

In one embodiment there is provided an adaptive control means to compensate for any drift in the wavelength peaks.

In one embodiment there is provided the means to compensate for any drift comprises means to include or exclude segments from a region depending on detected drift in the wavelength peaks.

In one embodiment there is provided an adaptive control means to compensate for any shift in the wavelength peaks between sweeps.

In one embodiment there is provided a trigger signal from the Laser and control section to the receiver section to synchronize the segment sweeps.

In one embodiment there is provided a trigger signal from the Laser and control section to the polarization switch/scrambler section to change the polarization state.

In one embodiment the optical assembly section is used to provide wavelength (absolute/relative) and power reference signals to the receiver section.

In one embodiment the optical splitter section is used to support multiple fibre channels containing an array of optical fibre based sensors.

In one embodiment said interrogator comprises means for performing real-time data processing in order to reduce the total data set to be transmitted to a central processing unit.

In one embodiment there is provided means for transmitting the interrogator measurements to a central processing unit over a dedicated or shared communication channel.

In one embodiment the scan rate of the laser is selected to be faster than the rate the sensors are moving. By sensors moving it is meant the movement of peak reflections measured between sweeps. The rate the sensors are moving is defined as the differential change between peak reflections measured between different sweeps in the sensor.

In one embodiment the sensor comprises a fibre bragg grating and/or any compatible optical sensor.

In another embodiment of the invention there is provided a method for measuring sensor characteristics obtained from an array of optical sensors using a dynamically swept tunable laser system, said method comprising the steps of:
dividing the total wavelength sweep of the laser into segments where the tuning across a segment is continuous;
each segment is referenced by a start and a stop reference and could be used to sweep the wavelength in any particular order and/or direction and is characterised by;
performing a sweep made up from a number of regions such that a region comprises a group of contiguous segments; and
determining sensor characteristics from each region swept by the tunable laser.

In a further embodiment of the present invention there is provided a method for performing a wavelength sweep by measuring segments where the wavelength peaks are located, said laser is adapted to remove segments of the sweep where no wavelength peaks are detected, wherein an interrogator will only measure segments of the sweep where wavelength peaks are located.

In a further embodiment of the present invention there is provided a method for performing a wavelength sweep in alternative directions either once or multiple times over a single segment or/and wavelength region.

In a further embodiment there is provided a dynamically swept tunable laser system for measuring sensor characteristics obtained from an array of optical sensors, said system comprising:
means for performing a sweep made up from a number of regions such that a region comprises a group of contiguous segments; and
sensor characteristics are determined from each region swept by the tunable laser.

In a further embodiment there is provided a method for measuring sensor characteristics obtained from an array of optical sensors using a tunable laser system, said method comprising the steps of:
performing a sweep made up from a number of regions such that a region comprises a group of contiguous segments; and
determining sensor characteristics from each region swept by the tunable laser.

In another embodiment of the present invention there is provided an adaptive control system for measuring wavelength peaks in one or more sensors adapted to receive an energy wave or signal, said system comprising means for performing a wavelength sweep by measuring segments where the wavelength peaks are located, said laser is adapted to remove segments of the sweep where no wavelength peaks are detected, wherein an interrogator will only measure segments of the sweep where wavelength peaks are located.

There is also provided a computer program comprising program instructions for causing a computer program to carry out the above method which may be embodied on a record medium, carrier signal or read-only memory.

In one embodiment the system is improved by increasing the number of tunable lasers used for sweeping so as to further increase the flexibility and speed at which the sensors are measured.

In one embodiment the reference system includes a power reference to compensate for any power variations in the output of the tunable laser.

In one embodiment the reference system includes one or more periodic frequency optical device such as an Etalon and/or Mach-Zehnder Interferometer to provide frequency correction of the tunable laser generated sweep segments.

In one embodiment the reference system includes one or more Gas cell reference to provide absolute frequency information.

In another embodiment there is provided another embodiment there is provided a dynamically swept tunable laser system to measure sensor characteristics obtained from an array of optical sensors from at least one wavelength sweep, said system comprising:
a module for dividing the total wavelength sweep of the laser into a plurality of regions in any particular order where each region comprises at least one or more contiguous sweep segments;
each sweep segment is referenced by a start and a stop reference and selected with different lengths compared to other sweep segments; and
a module for determining sensor characteristics from each segment swept by the tunable laser, wherein the tunable laser will only interrogate segments where sensor characteristics are determined for a subsequent wavelength sweep.

BRIEF DESCRIPTION OF THE DRAWINGS

The invention will be more clearly understood from the following description of an embodiment thereof, given by way of example only, with reference to the accompanying drawings, in which.

DETAILED DESCRIPTION OF THE DRAWINGS

The invention provides a dynamically swept tunable laser system for measuring sensor characteristics obtained from an array of optical sensors.

Figure 1:
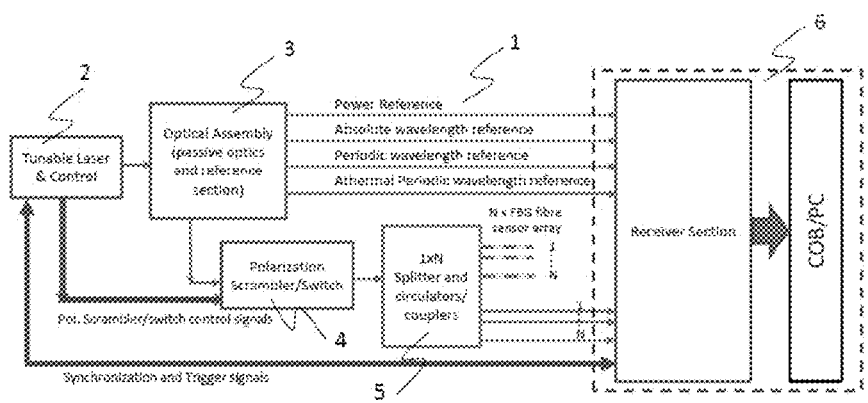
FIG. 1 shows a general block diagram of the main sections and interconnection between them for an N fibre channel tunable laser based optical interrogator.

The interrogator system design is shown in FIG. 1 indicated generally by the reference numeral 1, according to one aspect of the invention. The interrogator comprises five main sections, which is the tunable laser and its control unit 2, optical assembly 3 which includes all the passive optical components (splitters, couplers, circulators, . . . etc), optical reference system which includes an absolute wavelength reference (Gas cell), one or more periodic wavelength references (Etalon/Mach-Zehnder interferometer MZI, and a power reference, a receiver section which includes the photo-receivers, analog to digital converters (ADCs), FPGA, a polarization switch/scrambler section 4, an optical splitter section 5, and a processing unit that could be computer on board unit (COB) or any other processing unit device.

Figure 2:
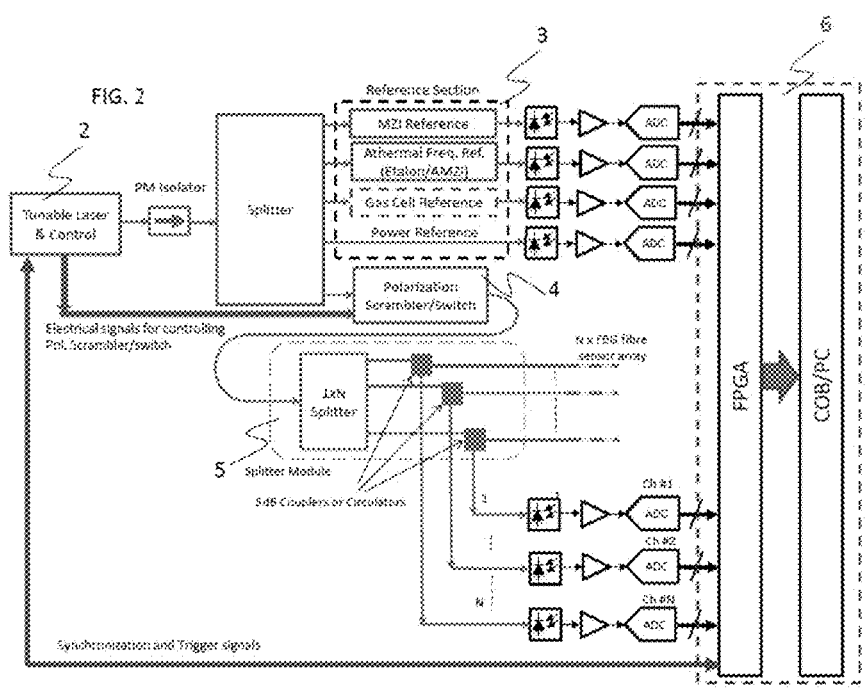
FIG. 2 shows a schematic diagram of an N fibre channel tunable laser based optical interrogator.

The interrogator unit in FIG. 2 shows a schematic diagram with the interconnection between the different sections of FIG. 1 in more detail. The leftmost section comprises the tunable laser transmitters and control unit, the optical assembly will hold the passive optics tray with polarization maintaining components, filters, splitters and splices and reference optical components (Gas Cell. Etalon, Mach-Zehnder Interferometer (MZI), . . . etc). The reference signals output fibres are then guided to the receiver section and the transmitted laser output tap is guided to the polarization switch/scrambler 4 and then to the optical splitter section 5 which includes a 1×N optical splitter and N number of 3 dB couplers/circulators which are then connected to N optical fibre channels that include the optical sensors. The signals reflected back from the sensors are then passed to the receiver section. The receiver section includes banks of photodiodes and receiver circuits which are connected to a high speed data processing FPGA (Field Programmable Gate Array). The high speed data is processed to reduce the data set and extract the averaged peak wavelengths of the sensors. This processed data is passed from memory to a processor.

The optics system may comprise of a C-band laser covering 1520-1560 nm and potentially more lasers covering different bands, such as using an L-Band laser covering 1560-1600 nm, giving an 80 nm total coverage. Using additional laser(s) can increase reliability and increase the number of interrogated sensors. Instead of using an L-band laser to double the number of sensors, an additional C-Band laser can be used instead combined with doubling the number of optical fibres to ensure parallel operation of both laser devices (see FIG. 2). Each laser output is split into N fibres, where each fibre contains multiple optical FBG sensors, dependent on the space/wavelength spacing between the different sensors and the dynamic range of each to avoid any wavelength overlap. Each tunable laser signal is also used to feed a referencing subsystem which provides the baseline accuracy of the measurement. The interrogator architecture is designed to operate in a quasi-continuous tuning mode such that only segments of interest are selected, as described in more detail below.

Sweep Rate Analysis

The sweep rate is ultimately limited by the slew rate of the tunable laser source being used. In one embodiment, this source could be an "SGDBR" tunable laser from JDSU, an "MG-Y" tunable laser from Ignis-Syntune-Finisar, a "DSDBR" laser from Bookham-Oclaro, or any other compatible tunable laser. Typically the slew rate is faster than 80 pm/mA for these devices, which means that the electronic tuning mechanism in the lasers is extremely fast.

Therefore it is possible to tune the output wavelength of the laser device by 1 pm by injection of 12.5 uA of current, or by 2 pm by injection of 25 uA. The limitation starts to shift from the laser to the electronics driving it rather than the tuning rate of the laser itself when high speed systems are being considered. As an example, if the laser was being controlled by a digital-to-analogue convertor (DAC) that could change state within 10 nanoseconds, this would drive a current source to change its output current by 12.5 uA. The resulting change in wavelength in 10 nanoseconds would be 1 pm. So the sweep rate would be 0.1 pm/nanosecond.

The system can calculate potential sweep rates for the full C-band of wavelengths using this analysis.

Figure 3:
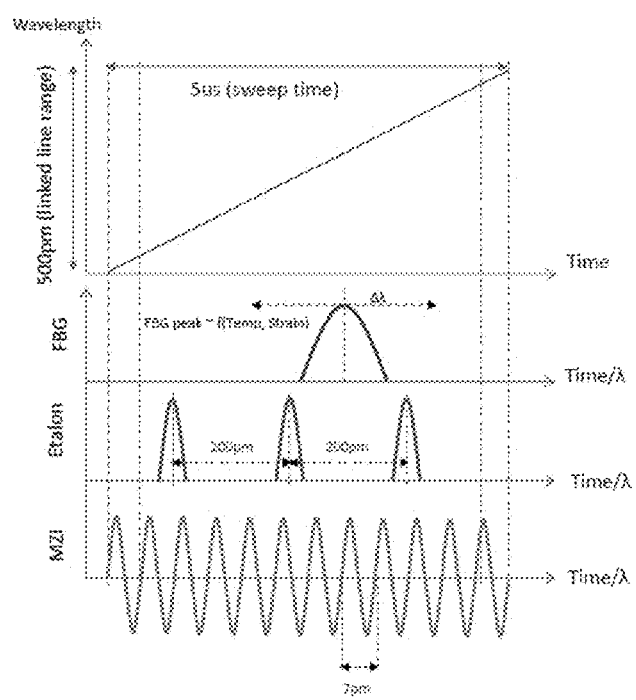
FIG. 3 illustrates a typical reflected FBG response measured over an individual 500 pm sweep segment (linked line) with its associated frequency reference channels (Etalon and MZI)

The interrogator design accounts for the fact that the tunable lasers cannot sweep or tune continuously over the full C-Band range (1520 nm-1560 nm). The method can stitch together multiple quasi-continuous tuning sweeps in the current interrogator design in order to achieve a full C-band sweep. FIG. 3 shows an example of a typical sweep of a single segment covering a 500 pm sweep which is used to scan over an FBG sensor and at the same time generate a wavelength reference signal from a periodic wavelength filter such as an Athermal Etalon and a Mach-Zehnder interferometer which can be used to assist the stitching between the different sweep segments. As an example, 100 quasi-continuous tuning segments, each covering 500 pm range could cover the whole C-band.

Figure 4:
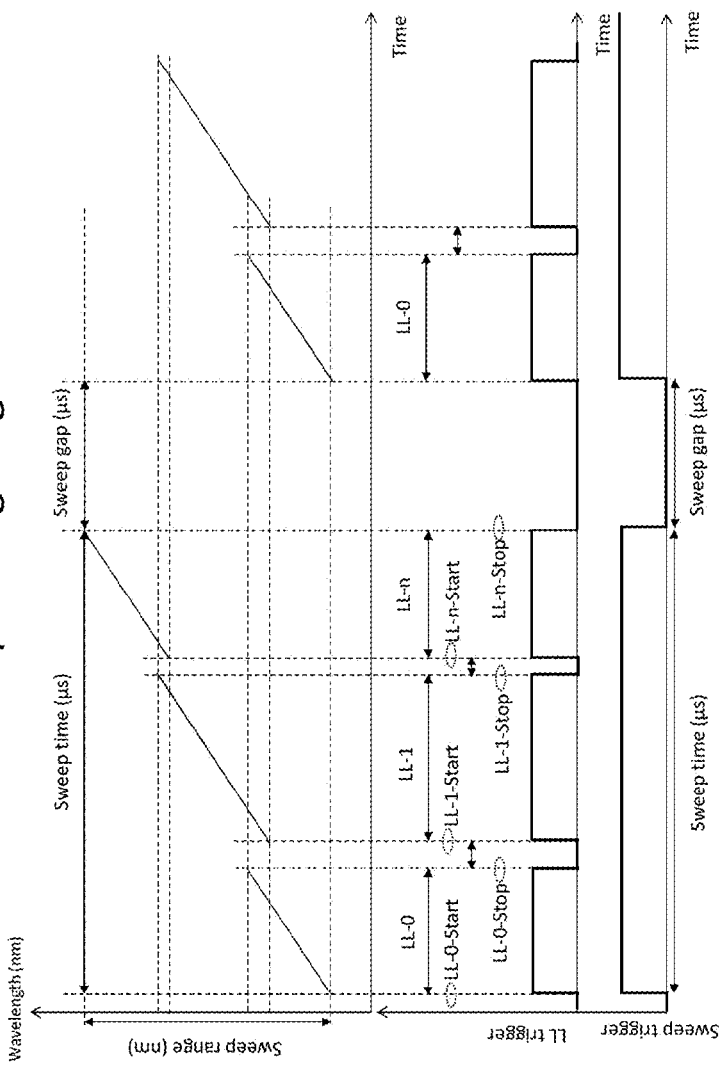
FIG. 4 illustrates the timing diagram of the individual sweep segments (linked lines)

There is a controllable time lapse required to switch the laser between each of these segments which will define the final sweep rate as shown in FIG. 4. The length of the segments and order are all controlled by the control block in the laser transmitter section 1. The control block 1 also generates the trigger signals for the polarization controlling device (switch/scrambler).

If the sensors under interrogation were experiencing large shifts in wavelength response at a much lower rate, then this high speed full-band sweep could be tailored by only selecting some of the quasi-continuous segments to tune the laser to. This is only possible in an electronically tunable laser system as the electronics can force the laser to effectively jump to anywhere in the spectrum.

Example Operation

Figure 5:
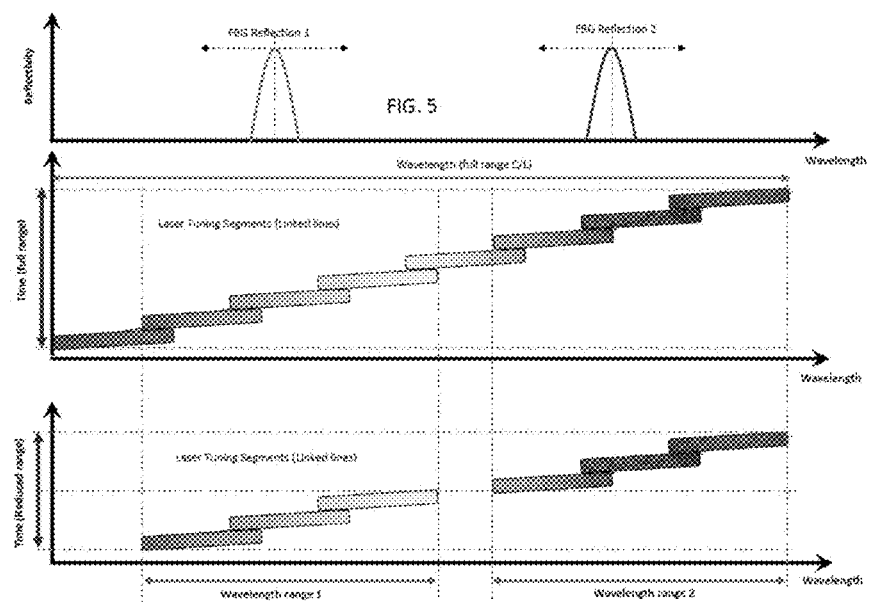
FIG. 5 illustrates the functionality of the continuous sweep (middle) compared to the Dynamic sweep (bottom) scanning two FBGs (top).

In operation, the laser performs a wavelength sweep by measuring regions and segments where the wavelength peaks are located, and removes segments of the sweep where no wavelength peaks are detected. The interrogator can measure segments of the sweep where only wavelength peaks are located as shown in FIG. 5. This is achieved by adapting the tunable laser to operate in a quasi-continuous tuning mode where the system can hop from one segment to another segment in any particular order for one sweep.

Figure 6:
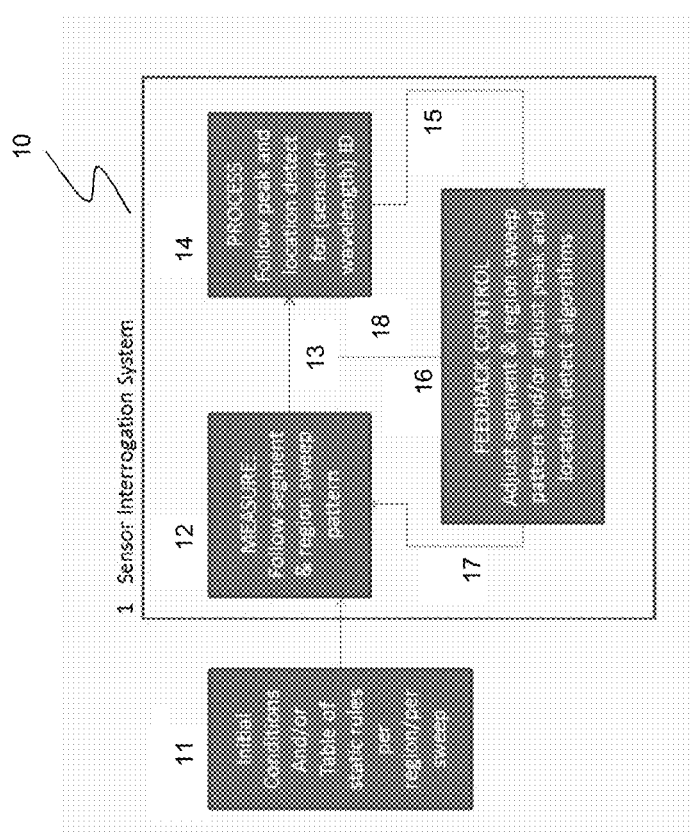
FIG. 6 illustrates a sensor interrogation system incorporating feedback control, according to one embodiment of the invention.

FIG. 6 illustrates a sensor interrogation system incorporating feedback control 15, 16, 17, 18, according to one embodiment of the invention, illustrated generally by the reference numeral 10. Initial conditions from module 11, e.g.

initial condition could be to perform a full sweep, or to perform a set of regions which are subsets of the full sweep, are fed to the sensor interrogation system 10. Note each region is made up of sweep segments. The length of a region is adjusted by adding or removing segments. Other initial conditions can be applied per sensor, including the number of times the region around that sensor should be scanned, or the resolution of the measurements taken within each region around a particular sensor.

A measurement module 12 takes the initial sweep conditions or the adjusted sweep conditions from the feedback loop and performs the sweep and measurement of the reflected signals. The data 13 is then fed into a data processing unit 14. The processing unit then detects peaks in the data and locates the centre wavelength of each sensor. The peaks detected and the sensor wavelength locations are then fed as data into a feedback controller 15. The feedback controller 16 can work on the data generated from the current sweep, or use a history of data generated from a number of previous sweeps. Note sweep here equals the particular set of regions that are interrogated. There are many ways to calculate the feedback signal.

The output fed back either by 17 to the measurement block or/and by 18 to the processing block. An example for 17 would be to adjust the start and stop points of a particular region for the next sweep, or increase or decrease the number of times that region is measured. The other feedback signal 18 can be fed into the processing unit. For example one can adjust per sensor the exact width of data around the centre wavelength to which to apply a peak detect algorithm, or the system can adjust the peak algorithm per sensor located.

If the location of the sensor peaks to be interrogated are known by the control system, the laser can be swept only over those segments of the spectrum where the sensor is located. If this represents 10% of the total spectrum, then the effective sweep rate can be increased by a factor of ten.

The embodiments in the invention described with reference to the drawings comprise a computer apparatus and/or processes performed in a computer apparatus. However, the invention also extends to computer programs, particularly computer programs stored on or in a carrier adapted to bring the invention into practice. The program may be in the form of source code, object code, or a code intermediate source and object code, such as in partially compiled form or in any other form suitable for use in the implementation of the method according to the invention. The carrier may comprise a storage medium such as ROM, e.g. CD ROM, or magnetic recording medium, e.g. a floppy disk or hard disk. The carrier may be an electrical or optical signal which may be transmitted via an electrical or an optical cable or by radio or other means.

In the specification the terms "comprise, comprises, comprised and comprising" or any variation thereof and the terms "include, includes, included and including" or any variation thereof are considered to be totally interchangeable and they should all be afforded the widest possible interpretation.

The invention is not limited to the embodiments hereinbefore described but may be varied in both construction and detail.

We claim:

1. A dynamically swept tunable laser system to measure sensor characteristics obtained from an array of optical sensors from at least one wavelength sweep, said system comprising:

a module configured to divide the total wavelength sweep of the laser into a plurality of regions in any particular order where each region comprises at least one or more contiguous sweep segments;

each sweep segment is referenced by a start and a stop reference and selected with different bandwidths compared to other sweep segments; and a module configured to determine sensor characteristics from each segment swept by the tunable laser, wherein the tunable laser will only interrogate segments where sensor characteristics are determined for a subsequent wavelength sweep.

2. The system of claim 1 wherein the module configured to determine the sensor characteristics comprises identifying segments where wavelength peaks are located and removing segments of the sweep where no wavelength peaks are detected, such that only segments with a wavelength peak are swept by the tunable laser for a subsequent wavelength sweep.

3. The system of claim 1 wherein the system is configured for receiving a reflected/transmitted response from at least one of said optical sensors.

4. The system of claim 1 wherein the tunable laser is adapted to operate in a sequential or non-sequential mode by selecting regions in any order.

5. The system of claim 1 wherein the wavelength sweep rates of regions are adapted to be changed such that some regions can be swept identified with a peak wavelength more times than other regions identified as having no peak wavelength.

6. The system of claim 1 wherein a control loop is configured and adapted to adjust the start and stop wavelength of each region based on the previous reflected/transmitted characteristics of a sensor located in that wavelength region.

7. The system as claimed in claim 1 wherein a processing algorithm is configured to run on a processor and adapted to determine sensor characteristics and adapted to adjust the sweep rate based on the sweep rate of the region and/or one or more previous performed sweeps of the sensor.

8. The system as claimed in claim 1 wherein a feedback control loop is adapted to adjust the wavelength region and/or segment sizes.

9. The system as claimed in claim 1 comprising an adaptive control module adapted to compensate for any drift in the wavelength peaks.

10. The system of claim 9 wherein the control module is adapted to compensate for any drift and configured to include/exclude and/or modify segments from a region depending on detected drift in the wavelength peaks.

11. The system as claimed in claim 1 comprising an adaptive control to compensate for any shift in the wavelength peaks between sweeps.

12. The system as claimed in claim 1 wherein an interrogator is configured for performing real-time data processing in order to reduce the total data set to be transmitted to a central processing unit.

13. The system as claimed in claim 12 wherein the central processing unit is adapted to store the data for future use as inputs into predictive software for different applications.

14. The system as claimed in claim 1 wherein the scan rate of the laser at which wavelength sweeps are performed is selected to be faster than the rate the sensor characteristics are changing.

15. The system as claimed in claim 14 wherein the rate the sensors are changes is defined as differential change between peak reflections measured between different sweeps.

16. The system as claimed in claim 1 wherein at least one sensor comprises a fibre bragg grating and/or any other compatible optical sensor.

17. A system as claimed in claim 1 wherein additional tunable lasers are configured to be added to further improve the wavelength range and tuning rate for the system.

18. A system as claimed in claim 1 comprising a reference system adapted to provide a power reference to compensate for any power variations in the output of the tunable laser.

19. A system as claimed in claim 18 wherein the reference system includes one or more periodic frequency optical device such as an Etalon and/or Mach-Zehnder Interferometer to provide frequency correction of the tunable laser generated sweep segments.

20. A system as claimed in claim 1 wherein the reference system includes one or more Gas cell references to provide absolute frequency information.

21. A method for measuring sensor characteristics obtained from an array of optical sensors using a dynamically swept tunable laser, said method comprising the steps of:
    dividing the total wavelength sweep of the laser into a plurality of regions in any particular order where each region comprises at least one or more contiguous sweep segments;
    referencing each segment seep by a start and a stop reference and selected with different bandwidths compared to other sweep segments; and
    determining sensor characteristics from each segment swept by the tunable laser, wherein the tunable laser will only interrogate segments where sensor characteristics are determined for a subsequent wavelength sweep.

22. The method of claim 21 wherein the step of determining the sensor characteristics comprises the additional steps of identifying segments where wavelength peaks are located and removing segments of the sweep where no wavelength peaks are detected, such that only segments with a wavelength peak are swept by the tunable laser for a subsequent wavelength sweep.

23. A computer program comprising program instructions for causing a computer to control the method of claim 21.

24. A dynamically swept tunable laser system to measure sensor characteristics obtained from an array of optical sensors from at least one wavelength sweep wherein the sweep is divided into a plurality of segments, said system is configured for determining sensor characteristics by identifying segments where wavelength peaks are located and removing segments of the sweep where no wavelength peaks are detected, such that only segments with a wavelength peak are swept by the tunable laser for a subsequent wavelength sweep.

25. An adaptive control system for measuring wavelength peaks in one or more sensors adapted to receive an energy wave or signal, in combination with a tunable laser, said system is configured for performing a wavelength sweep by measuring segments where the wavelength peaks are located, said laser is adapted to remove segments of the sweep where no wavelength peaks are detected, wherein an interrogator will only measure segments of the sweep where wavelength peaks are located for subsequent wavelength sweeps.

* * * * *